US006897151B2

(12) United States Patent
Winter et al.

(10) Patent No.: US 6,897,151 B2
(45) Date of Patent: May 24, 2005

(54) METHODS OF FILLING A FEATURE ON A SUBSTRATE WITH COPPER NANOCRYSTALS

(75) Inventors: Charles H. Winter, Bloomfield Hills, MI (US); Zhengkun Yu, Detroit, MI (US); Charles L. Dezelah, IV, Detroit, MI (US); Avery N. Goldstein, Huntington Woods, MI (US)

(73) Assignee: Wayne State University, Detroit, MI (US)

( * ) Notice: Subject to any disclaimer, the term of this patent is extended or adjusted under 35 U.S.C. 154(b) by 40 days.

(21) Appl. No.: 10/290,498

(22) Filed: Nov. 8, 2002

(65) Prior Publication Data

US 2004/0091625 A1 May 13, 2004

(51) Int. Cl.$^7$ ............................................. H01L 21/44
(52) U.S. Cl. ..................... 438/687; 438/660; 438/597
(58) Field of Search ............................... 438/584, 597, 438/660, 687

(56) References Cited

U.S. PATENT DOCUMENTS

| | | |
|---|---|---|
| 5,262,357 A | 11/1993 | Alivisatos et al. |
| 5,491,114 A | 2/1996 | Goldstein |
| 5,559,057 A | 9/1996 | Goldstein |
| 5,576,248 A | 11/1996 | Goldstein |
| 5,670,278 A | 9/1997 | Goldstein |
| 5,755,987 A | 5/1998 | Goldstein et al. |
| 5,755,988 A | 5/1998 | Lane et al. |
| 5,850,064 A | 12/1998 | Goldstein |
| 5,953,629 A | 9/1999 | Imazeki et al. |
| 6,060,026 A | 5/2000 | Goldstein |
| 6,194,316 B1 | 2/2001 | Oda et al. |
| 6,214,259 B1 | 4/2001 | Oda et al. |
| 6,268,041 B1 | 7/2001 | Goldstein |
| 6,277,740 B1 | 8/2001 | Goldstein |
| 6,361,660 B1 | 3/2002 | Goldstein |
| 6,517,642 B2 | 2/2003 | Horie et al. |
| 2002/0006723 A1 | 1/2002 | Goldstein |
| 2002/0098680 A1 | 7/2002 | Goldstein |
| 2003/0008145 A1 | 1/2003 | Goldstein |

OTHER PUBLICATIONS

Murakami et al., J. Vac. Sci. Technol. B. 1999, 17, 2321–2324.
A.E. Kaloyeros et al., MRS Bull. (Jun. 1993), pp. 22–29.
C. Solliard et al., Surf. Sci. 156 (1985), pp. 487–494.
J. Woltersdorf et al., Surf. Sci. 106 (1981), pp. 64–69.
Ph. Buffat et al., Phys. Rev. A, 13 (1976), pp. 2287–2298.
C. J. Coombes, J. Phys. 2 (1972), pp. 441–449.
J. Eckert et al., Nonostruct Matls. 2 (1993), pp. 407–413.
C. R. M. Wronski, Brit. J. Appl. Phys. 18 (1967), pp. 1731–1737.
M. Wautelet, J Phys. D, 24 (1991), pp. 343–346.
. T. Miller et al., J. Mater Res. 5 (1990), pp. 151–160.
B. A. Korgel et al., Phys. Rev. Let. 80 (1998), pp. 3531–3534.
A. G. Evans et al., J. Mater. Res. 3 (1998), pp. 1043–1049.

*Primary Examiner*—Richard Elms
*Assistant Examiner*—Brad Smith
(74) *Attorney, Agent, or Firm*—Kenyon & Kenyon

(57) ABSTRACT

The invention relates to methods of making monodisperse nanocrystals comprising the steps of reducing a copper salt with a reducing agent, providing a passivating agent comprising a nitrogen and/or an oxygen donating moitey and isolating the copper nanocrystals. Moreover, the invention relates to methods for making a copper film comprising the steps of applying a solvent comprising copper nanocrystals onto a substrate and heating the substrate to form a film of continuous bulk copper from said nanocrystals. Finally, the invention also relates to methods for filling a feature on a substrate with copper comprising the steps of applying a solvent comprising copper nanocrystals onto the featured substrate and heating the substrate to fill the feature by forming continuous bulk copper in the feature.

46 Claims, 4 Drawing Sheets

1) Hold for 1.0 min at 50.00 °C
2) Heat from 50.00 °C to 700 °C at 10.00 C/min
3) Hold for 1.0 min at 700.00 °C
4) Cool from 700.00 °C at 50.00 C/min

METHODS OF FILLING A FEATURE ON A SUBSTRATE WITH COPPER NANOCRYSTALS

FIELD OF THE INVENTION

The invention relates to methods of making macroscopic quantities of monodisperse, soluble copper nanocrystals. The present invention also relates to microelectronic trenched feature formation and more particularly to the formation of an interconnect from a copper nanocrystal solution.

BACKGROUND OF THE INVENTION

An integrated circuit requires conductive interconnects between semiconducting domains in order to communicate signals therebetween. In order to create ever faster microprocessors, smaller dimension interconnects of higher conductivity materials is an ongoing goal.

As microelectronic efficiencies have increased, interconnects have decreased in dimensional size and efforts have been made to increase the electrical conductivity of interconnect features. It is becoming increasingly difficult to design and fabricate ultralarge scale integrated circuits (ULSI) chips with the desired high packing density and high-speed operation. This is not due to the difficulty of transistor scaling but to the interconnect delay in distributing high frequency signals across the ULSI chip. Therefore, the significance of interconnect technologies has become much greater in view of the ongoing need for ever smaller interconnects. Accordingly, there is a need for novel interconnect-forming technologies.

The rapid miniaturization of interconnects is occurring simultaneously with the transition from aluminum (Al) to copper (Cu) metallization for sub-0.25 $\mu$m interconnects (IC). It is now becoming apparent that a major component of improved interconnect performance will consist in replacing aluminum, the previous metal of choice, with copper. Murakami et al., J. Vac. Sci. Technol. B. 1999, 17, 2321–2324, have indicated that due to its electromagnetic resistance, low resistivity, and high reliability against electromigration Cu is thought to be the most attractive substitute for Al alloys in integrated circuit manufacturing. The transition from Al to Cu has led to a change in the way interconnects are formed. While Al has been deposited as a blanket layer which is then patterned by reactive ion etching, Cu interconnects are formed by evaporative deposition into preformed (damascene) trenches and vias followed by chemical mechanical polishing (CMP).

As the interconnect width decreases and the aspect ratio increases, conventional vacuum deposition techniques approach the theoretical resolution threshold. Deep, narrow trenches and vias preferentially collect material at the damascene feature edges, leading to void formation. Blanket and selective chemical vapor deposition (CVD) are well-established Cu deposition techniques that have a demonstrated ability to fill current interconnect trenches. (A. E. Kaloyeros and M. A. Fury, MRS Bull. (June 1993), pp. 22–29). This process of involves heating a metal until it vaporizes and then condensing the vaporized metal condenses onto a cold surface. The process is cumbersome in terms of time, money and energy. Additionally, heating of the IC substrate during CVD to assure crystalline growth degrades fine architecture structures on the substrate.

The cost of Physical vapor deposition (PVD) and chemical vapor deposition (CVD) equipment capable of performing either of these processes is about $1 million. This cost does not include the cost, time, and materials associated with intermediate polishing prior to fill. Additionally, PVD is a competing technique to CVD. The formation of a seed layer is essential prior to trench filling by electrochemical deposition (ECD). ECD may be used to achieve conformal fill of ICs, trenches, and vias into which a seed layer has been grown by CVD or PVD. Thus, existing methods require additional steps of (a) depositing seed layers prior to fill, (b) intermediate cleaning between seed layer deposition, and (c) a final chemical mechanical polishing step to remove the conformal metal coating after fill. In addition to the high purchase cost of a separate chamber to perform each of these additional steps, each step adds about $1 per metallization layer in consumable materials cost.

In any case, CVD does not inherently fill trenches preferentially over any other portion of substrate having nucleation sites. Therefore a method that preferentially deposits Cu into trenches based on differential solvent evaporation associated with trenches is needed.

Thus, the semiconductor industry is in need of a copper interconnect formation process capable of achieving higher resolution at lower temperature and ideally, at a lower cost. The successful synthesis of Cu nanocrystals will offer the semiconductor industry a thermodynamically metastable source for copper metallization. Based on the literature and reagent costs, copper nanocrystal synthesis could be expected to yield a suitable precursor at a lower cost than CVD.

The mesoscopic size regime between atoms and bulk materials is characterized by unusual properties. Mesoscopic systems exhibit collective atomic behavior, but not to a sufficient extent so as to preclude quantized effects. Many of the unusual thermodynamic and spectroscopic anomalies associated with mesoscopic systems are attributable to surface effects. Studies have shown surface energies that are 10 to 400% greater for nanocrystals than for bulk gold (Au) and platinum (Pt) (C. Solliard and M. Flueli, Surf. Sci. 156 (1985), pp. 487–494), and Al (J. Wolterdorf, A. S. Nepijko and E. Pippel, Surf. Sci. 106 (1981), pp. 64–72). In the bulk, surface atoms represent such a small percentage of the total that surface effects are largely inconsequential. Surfaces generally possess modified atomic coordination numbers, geometries and diminished lattice energies relative to the bulk. The result of these modifications is that physical, spectroscopic, and thermodynamic properties, which are constant in the bulk, become size dependent variables in nanocrystals. The ability to modify the thermodynamic properties of nanocrystals, particularly the melting temperature, is exploited in the present invention to produce thin film copper IC structures at low temperature.

Metallic nanocrystals have been shown to reduce melting temperatures compared with the bulk. (Ph. Buffat and J-P. Borel, Phys. Rev. A, 13 (1976), pp. 2287–2298; C. J. Coombes, J. Phys. 2 (1972), pp. 441–449; J. Eckert, J. C. Holzer, C. C. Ahn, Z. Fu and W. L. Johnson, Nanostruct. Matls. 2 (1993), pp. 407–413; C. R. M. Wronski, Brit. J. Appl. Phys. 18 (1967), pp. 1731–1737 and M. Wautelet, J Phys. D, 24 (1991), pp. 343–346). The depression in melting and annealing temperature is evident throughout the nanocrystal size regime, with the most dramatic effects observed in nanocrystals having a diameter from 2 to 6 nm. Melting studies on a range of nanocrystals have established that the melting temperature is size dependent in the nanometer size regime and is approximately proportional to the inverse particle radius regardless of the material identity. The size dependent melting temperature of metallic nanocrystals has included studies of Au, Pb and In, Al and Sn. (Au: Ph. Buffat and J-P. Borel, Phys. Rev. A, 13 (1976), pp. 2287–2298; Pb and In: C. J. Coombes, J. Phys. 2 (1972), pp. 441–449; Al: J. Eckert, J. C. Holzer, C. C. Ahn, Z. Fu and W. L. Johnson, Nanostruct. Matis 2 (1993), pp. 407–413; and Sn: C. R. M. Wronski, Brit. J. Appl. Phys. 18 (1967), pp. 1731–1737).

The reduction in melting temperature as a function of nanocrystal size can be enormous. For example, 2 nm Au nanocrystals are predicted to melt at about 300 degrees Celsius, as compared to 1065 degrees Celsius for bulk gold. (M. Wautelet, J. Phys. D, 24 (1991), pp. 343–346).

Numerous techniques exist for the preparation of metal colloids. Surprisingly, little attention has been paid to monodispersity and solubility of Cu nanocrystals. Monodispersity refers to a unimodality or uniformity of nanocrystal size in solution as opposed to polydispersity which connotes a solution having a range of nanocrystal sizes. Monodisperse Au nanocrystals having an alkane-thiol capped surface are readily synthesized in a two-phase reaction, with resulting particles being highly soluble in toluene and/or hexane. Many liquid phase syntheses also exist for Ag nanocrystals, but with less control over particle size distribution. Silver nanoparticle syntheses are only to a very limited extent adapable to making Cu nanocrystals. Inherent inadequacies in conventional nanoparticle synthesis technology with respect to polydispersity and solubility, preclude the formation of high conductivity interconnects necessary for internal communication within an IC. For example, the polydispersity of Cu nanocrystals made by conventional methodology, results in a broad range of melting temperatures and leads to comparatively high resitivity in interfacial regions between particles melting at variable temperatures.

Unsuccessful attempts have been made to obtain Cu nanocrystals involving a number of methodologies. INn one method hydrazine carboxylate was used as a ligand for $Cu^{2+}$. The intent was to produce copper nanocrystals from the decomposition of the hydrazine carboxylate complex of $Cu^{2+}$ in the presence of a passivating agent. Hydazine carboxylate would act as a reducing agent for copper, itself being oxidized to gaseous products. This experiment failed to produce any copper nanocrystals. Problems included but are not limited to: poor solubility of the copper hydrazine carboxalate complex and recovery of only bulk copper from the reaction mixtures. Additionally, hydrazine carboxylate and complexes thereof are potentially explosive making them difficult to work with. As such, this method is not capable of forming suitable nanocrystal colloids.

A proposed alternative to make Cu nanocrystals involved reducing Cu salts in water and pyridine, followed by the addition of sulfur-containing ligands, such as alkylthiols, alkylthiophenes, and alkylxanthates initially showed great promise. They afforded nanocrystals that generally possessed good solubility in a wide range of organic solvents. Air-stability of nanocrystals passivated by the above ligands was found to be excellent. Copper nanocrystals passivated by the above mentioned sulfur-containing ligands were characterized by Transmission Electron Microscopy (TEM), Powder X-ray Diffraction (XRD), Thermogravimetric Analysis (TGA), Differential Thermal Analysis (DTA), and Atomic Force Microscopy (AFM). Data generally agreed with that expected for copper nanocrystals having a size between 2 nm and 10 nm. However, the sulfur-containing set of passivating agents/ligands was ultimately abandoned when it became apparent that nanocrystals passivated by such ligands led to $Cu_2S$ or $Cu_2S/Cu$ mixtures under thermolysis conditions. Generally thermolysis under an inert atmosphere (nitrogen or argon) gave $CU_2S$, whereas thermolysis under a reducing atmosphere (5% Hydrogen/95% nitrogen). Thermolysis products were determined by XRD.

Finally, syntheses using alkylamine-ligands and reduction in the presence of pyridine, also yielded copper nanocrystals. However, such syntheses generally yielded a black, insoluble powder (>95%) and a very faintly colored amber solution. The solution was found to contain copper nanocrystals in the range of 2 nm to 10 nm in size by AFM. The amount of soluble material present was certainly so miniscule (probably microgram scale) that any application of such nanocrystals would be impossible.

SUMMARY OF THE INVENTION

One aspect of the current invention relates to a method of making monodisperse nanocrystals comprising the steps of reducing a copper salt with a reducing agent to obtain reduced copper; providing a passivating agent to contact the reduced copper, wherein the passivating agent comprises a nitrogen and/or an oxygen donating moitey and isolating the nanocrystals comprising the reduced copper.

In one embodiment of this aspect of the invention, the passivating agent comprises an imidazole moiety. In another embodiment of this aspect of the invention the passivating agent is 1-decyl-2-methylimidazole.

In another embodiment of this aspect of the invention, the passivating agent comprises an ammonium or alkylammonium alkylcarboxylate moiety. In another embodiment of this aspect of the invention the passivating agent is tetra-n-octylammonium decanoate.

Another aspect of the invention relates to a method for producing a copper film comprising the steps of applying a solvent comprising copper nanocrystals dissolved therein onto a substrate, wherein the copper nanocrystals are made using the methodology described herein; and heating the substrate to form a film of continuous bulk copper from the nanocrystals on the substrate.

In one embodiment of this aspect of the invention, the substrate comprises silicon. In another embodiment of this aspect of the invention, the substrate comprises $SiO_2$.

Yet a further aspect of the invention provides for methods to fill a feature on a substrate with copper comprising the steps of applying a solvent comprising copper nanocrystals onto the featured substrate, wherein the copper nanocrystals are made using the methodology described herein; and heating the substrate to fill the feature by forming continuous bulk copper from the nanocrystals in the feature. In one embodiment of this aspect of the invention, the substrate comprises silicon.

In one embodiment of this aspect of the invention, the feature is a via. In another embodiment of this aspect of the invention, the feature is a trench with an aspect ratio in the range of about 1.6 to about 10. In yet another embodiment of this aspect of the invention, the feature is in the form of an interconnect (IC). In yet a further embodiment of this aspect of the invention, the nanocrystals selectively collect within recesses of said features as opposed to plateaus of the substrate.

DETAILED DESCRIPTION OF THE INVENTION

Figure 1:
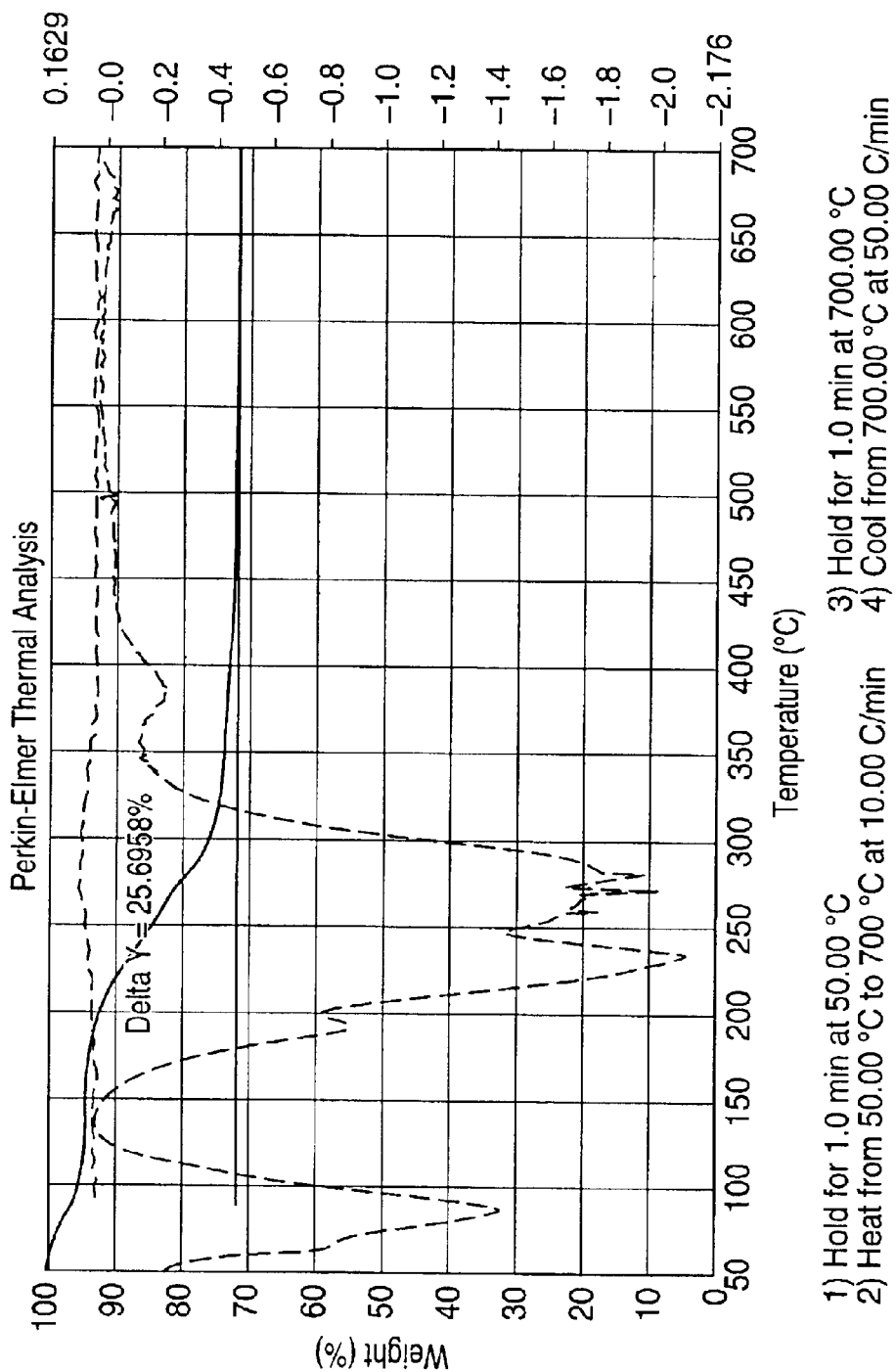
FIG. 1 shows Thermogravimetric analysis of passivated copper nanocrystals.

The present invention relates to methods of making macroscopic scale syntheses of monodisperse, copper nanocrystals suitable for use as IC seed layers or interconnects, where none existed before. The nanocrystals made according to the subject invention, will possess a passivating agent to confer solubility and air stability and stability against aggregation. The passivating agent is used to arrest growth of the particles at a pre-determined and uniform size, yet upon heating will volatilize. This is interchangeably referred to as thermolysis. The effectiveness of various passivating agents and reaction conditions have been assessed with regard to particle polydispersity, solubility, passivating agent volatilization and compatibility with other process steps associated with IC manufacture. The inventors have discovered that passivating agents comprising nitrogen and/or oxygen donor moieties efficiently facilitate the macroscopic production of monodisperse and soluble Cu nanocrystals which are of adjustable domain size, typically from about 1 to about 20 nm, and are amenable to bulk formation upon heating. Copper nanocrystals made using the methodology described herein may be used to produce copper films or fill features on a substrate. Conventional methods of rendering copper nanocrystals do not provide sufficient quantities or workable amounts of monodisperse copper nanocrystals to carry out such methods. This is the challenge that has been overcome by the present invention.

Monodispersity refers to a relative unimodality or uniformity of nanocrystal size in solution as opposed to polydispersity which connotes a solution having a range of nanocrystal sizes. Monodisperse Cu nanocrystals have a relatively uniform melting temperature resulting in a narrow melting temperature range for a population of monodisperse Cu nanocrystals.

The nanocrystal is defined as a particle having a linear dimension in any direction on the order of nanometers, namely about 1 to about 100 nm in diameter. Preferably, the nanocrystal of the present invention is between about 1 and about 20 nm. More preferably, the nanocrystal of the present invention is between about 1.5 and about 10 nm. Most preferably the nanocrystal of the present invention is between about 2 and about 6 nm. The size distribution of the nanocrystals in solution is of some importance, since the sintering temperature of particles in this size regime is size dependent. Likewise, the melting temperature is size dependent. Preferably, a size distribution of less than 30% of the average particle diameter is used for nanocrystals of an average diameter of less than about 6 nm with increasingly greater tolerances being preferred as the average particle increases beyond 6 nm. Alternatively, smaller nanocrystals having a lower melting temperature form a flux that facilitates uniform melting of larger nanocrystals within the distribution. The nanocrystals are optionally either dispersed in a solvent by conventional means illustratively including sonication, agitation, solution shearing and the like. The nanocrystal surface is coupled to a passivating agent by adsorption or chemically bonding thereto. The passivating agent preferably being soluble in the solvent and thus imparting solubility to the particles. Preferably, the nanocrystals are soluble to promote segregation into low volatilization rate, trench and via regions as compared to substrate plateaus.

The nanocrystal size is selected to take advantage of size dependent sintering and melting temperatures. The stability of the underlying substrate architecture is typically the controlling factor in determining optimal melting temperature and thus nanocrystal size. Preferably, nanocrystals are selected having a minimal heating requirement to obtain desired electrical conductivities from the resulting bulk structure of less than about 450 degrees Celsius. More preferably, the nanocrystals are heated to less than about 350 degrees Celsius. Most preferably, the nanocrystals are heated to less than about 300 degrees Celsius. The melting temperature of various sizes of nanocrystals is calculable (Wautelet, J. Phys. D, 24 (1991), p. 343).

Sintering is defined herein as the interfacial coalescence of contiguous particles while the particle cores retain prior crystalline properties. Sintering temperature is calculable or approximated as two-thirds of the substance melting temperature in degrees Kelvin. Further, heating beyond the sintering temperature brings the nanocrystals to a size dependent melting temperature. Melting of a contiguous matrix of nanocrystals results in a densified polycrystalline bulk structure limiting the interfacial resistivity between sintered domains. Once the passivating agent is volatilized contiguous nanocrystals are able to sinter. The relevant volatilization sintering and melting temperatures for a given nanocrystal solution are determinable through thermal analysis, techniques such as differential scanning calorimetry (DSC), thermal gravimetric analysis (TGA), temperature dependent spectroscopies, differential thermal analysis (DTA) and conductivity.

The passivating agent, as defined herein, is a compound introduced to prevent nanocrystal growth beyond a pre-selected size and preferably to also impart solubility on the nanocrystal in a solvent. The passivating agent is used to arrest growth of the particles at a pre-determined and uniform size, yet upon heating will volatilize such that nanocrystals decompose to pure copper metal with complete evaporation of the passivating agent. The passivating agent illustratively includes a variety of thermally volatile organics including those of the formula XRY where X is a moiety capable of chemically bonding to a surface Cu atom of the Cu nanocrystal and illustratively includes imidazole, pyridine, bipyridine, phenanthroline, ammine, amine, nitrile, nitride or other nitrogen donors; alkoxides, oxides, ethers, carboxylates, acetoacenoates, sulphoxide, hydroxide, acetate, lactate, propionate, oxalate, maltolate or other oxygen donors. R is $C_1$–$C_{30}$ aliphatic, aryl or heteroatom substituted derivative thereof and may also include substituent moieties extending from the alkyl chain or heteroatoms within the chain. Y is X, hydrogen, or may also include moieties other than hydrogen that are not capable of forming a bond to copper. Such terminal moieties could find potential use in tailoring the passivating agent for maximum solubility in solvent systems optimal for spin coating. Examples of such terminal "Y" groups can include the hydroxyl moiety, alkoxy groups, a ketone moiety, or even alkyl or aryl ester moieties. The RY portion of the passivating agent is optionally chosen to interact with the solvent to impart solubility. In another embodiment, Y bonds to the surface of a second nanocrystal to tether nanocrystals together. Further, dendritic or polymeric variants of XRY are operative to form an extended matrix of nanocrystals. The nanocrystal surface binding passivating agent moiety being dictated by established organometallic chemistry. Thermolysis, i.e. volatilization upon heating, of the passivating agent is provided by induction heating, photolysis, sonication, laser ablation and introduction of a heated gas stream. The invention also contemplates a passivating agent comprising an electrically conductive polymer that electrically couples contiguous nanocrystals to one another obviating the need for passivating agent volatilization. It is understood that the "XRY" model is useful in describing the characteristics of a typical passivating agent, but it should not limit the breadth of possible passivating molecules. For example, a number of the moieties described as being a possible choice as "X" themselves exist as molecules capable of acting in a passivating fashion in other circumstances, exclusive of the above described "R" or "Y" groups.

One aspect of the present invention provides a method for the production of Cu nanocrystals to overcome the fact that the prior art does not teach any methods for producing the sufficient volumes of monodisperse Cu nanocrystals suitable for producing interconnect formations. This aspect of the invention, utilizes a passivating agent to prevent Cu nanocrystal growth beyond a pre-selected size and preferably to also impart solubility on the nanocrystal in a solvent. As opposed to previously used passivating agents ineffectual for producing monodisperse Cu nanocrystals, the inventors have found that passivating agents comprising nitrogen and/or oxygen donor moieties efficiently facilitate the macroscopic production of monodisperse and soluble Cu nanocrystals which are of adjustable domain size, typically from about 1 to about 20 nm, and are amenable to bulk formation upon heating. Copper nanocrystals that are soluble in a chosen solvent through coordination of an organic passivating agent to the surface of the nanocrystal, should decompose to pure copper metal with complete thermolysis of the passivating agent. The nanocrystals will be sized to melt to bulk copper upon heating to temperatures of less than about 350° C., preferably less than about 300° C. Heating of copper nanocrystal-coated substrates proceeds optimally under a nitrogen atmosphere containing a small amount of hydrogen. The hydrogen reduces any copper oxides. Semiconductor tool manufacturers indicate that spin coating equipment already in place in a fabrication line can be used without modification with the smelting of copper nanocrystals. Example 1 exemplifies a method of making Cu nanocrystals.

One embodiment appreciates that the isolation of nanocrystals as a solid precipitate is facilitated by the use of such surfactants. For example, surfactants such as but not limited to 1-heptyl-4-(4-pyridyl)pyridium bromide, added to reaction mixtures subsequent to reduction, yields substantially improved preparations. Preferably, such surfactants are used with for those preparations using imidazole-based passivating agents.

Cu inorganic salts are commercially available at high purity and low cost. Copper ions are readily reduced to copper metal in the presence of a reducing agent. A reducing agent as defined herein refers to a substance that reduces another substance and is oxidized. Examples of reducing agents include but are not limited to sodium borohydride or hydrazine. The addition of the reducing agent prevents a copper ion bonded to the passivating agent from bonding to other copper atoms at the bonding site occupied by the passivating agent, ultimately making the passivating agent-bound copper atom a surface atom of a growing nanocrystal. By Adjusting the ratio of passivating agent to copper, the ratio of copper surface atoms to copper interior atoms is controlled. For example, a copper to passivating agent ratio of about 3:1 yields nanocrystals of about 2.9 nm. These ratios are hypothetical examples based on a proposed model of how nanocrystals are believed to form. A spherical nanocrystal of a given size should have a highly predictable number of surface copper atoms. If each surface atom is chemically bonded to one molecule of passivating agent, then in theory one can control the size by careful control of the quantity of passivating agent, effectively dictating the number of surface atoms during the stage of nanocrystal formation Copper nanocrystal synthesis according to the present invention, may proceed in conventional glassware.

Synthesis of copper nanocrystals of about 1 to about 20 nm are passivated with either passivating agents comprising nitrogen and/or oxygen donor moieties. These copper nanocrystals melt at less than about 350° C., exhibit X-ray diffraction spectra consistent with copper metal, and are highly soluble (up to about 10 wt. %) in organic solvents ranging from organic solvents ranging from fluorocarbons, n-alkanes to alcohols. Examples include but are not limited to water, acetonitrile, methanol, isopropanol, hexanes, dodecane, toluene, cyclohexanone, diethyl ether, tetrahydrofuran, dichloromethane, acetone, and ethanol. With appropriate passivating agents, water may even be used as a solvent for the nanocrystals. Thermolysis of the nanocrystals at less than about 350° C. under a nitrogen/hydrogen atmosphere affords substantially pure copper metal, with complete evaporation of the passivating agents. Substantially pure copper refers to copper metal with low content of carbon, oxygen, or other elements. Additionally, pure copper refers to copper that possesses electrical resistivities equal to or close to that of a standard pure copper metal reference. Weight loss upon heating, as measured by thermogravimetric analysis, is generally in the range of about 15 to about 40%, preferably about 20 to about 35 percent and most preferably about 27 to about 32%. Thermogravimetric analysis indicates that evaporation of passivating agents occurs between about 125–250° C. Spin coating of nanocrystal solutions onto TaN-coated silicon wafers, followed heating at 350° C. under a nitrogen/hydrogen atmosphere, affords copper films that exhibit bulk resistivity values. XPS analysis of these films indicated pure copper metal, with no oxides present. The films of the present invention are highly adherent, and pass the Scotch® tape test.

One embodiment of this aspect of the invention, utilizes a passivating agent wherein X (of passivating agent structure XRY, described supra) comprises tetraoctylammonium, alkoxides, oxides, ethers, carboxylates, acetoacenoates, sulphoxide, hydroxide, acetate, lactate, propionate, oxalate, maltolate or other oxygen donating moieties to prevent Cu nanocrystal growth beyond a pre-selected size and preferably to also impart solubility on the nanocrystal in a solvent. The inventors have found that ammonium moieties, including tetraoctylammonium ion are do not themselves act as a ligand, due to the lack of ability to donate electrons to a metal atom. Ammonium and alkylammonium groups are positively charged ions and are able to act as counter-ion to a negatively charged ligand species. Despite the lack of donor abilities of ammonium ions, they help provide stability of the nanocrystal toward air and toward agglomeration when coupled to an appropriate negatively charged passivating ligand.

Preferably, the oxygen-donating passivating agent is a linear $C_2$–$C_{24}$ having an oxygen donating moiety. Preferable oxygen-donating passivating agents are sodium decanoate, tetraoctylammonium octylxanthate, potassium octylxanthate and tetraoctylammonium octylxanthate. Even more preferable for this embodiment is utilization of ammonium or alkylammonium alkylcarboxylates. Most preferably, tetra-n-octylammonium decanoate is used as an oxygen donating passivating agent.

Another embodiment of this aspect of the invention utilizes a passivating agent wherein X (of passivating agent structure XRY, described supra) comprises an imidazole, pyridine, bipyridine, phenanthroline, ammine, amine, nitrile, nitride or other nitrogen dononating moieties to prevent Cu nanocrystal growth beyond a pre-selected size and preferably to also impart solubility on the nanocrystal in a solvent. In this embodiment, the preferable passivating agent is a linear $C_2$-$C_{24}$ having a nitrogen donating moiety. Even more preferable for this embodiment is utilization of long chain alkyl imidazoles.

Most preferably, 1-decyl-2-methylimidazole is used as a nitrogen donating passivating agent.

In another aspect of the present invention, a method is detailed herein to create copper films from copper nanocrystals, wherein the copper nanocrystals are made using the methodology described supra. First, a solvent comprising the copper nanocrystals delivered to a substrate. The substrate is then heated to form a continuous bulk copper from the nanocrystals onto the substrate. The nanocrystal solutions or suspensions are applied by spray or spin coating onto a substrate.

"Substrates" as defined herein may be any rigid or flexible surface that could be coated with copper films. The terms substrate therefore may also by used to refer to particles such as powders that my be coated with the disclosed methods. Exemplary substrates are silicon, $SiO_2$, TiN-coated (1000 Å by PVD) flat silicon wafers, and TaN-coated (1000 Å by PVD) flat silicon wafers. $SiO_2$ wafers flat silicon wafers are preferable. TaN-coated are more preferable. TiN coated flat silicon wafers are most preferable. One of skill in the art could recognize a range of additional substrates given that the methods disclosed herein could be readily extended to other systems by analogy. For example, deposition in a microelectronics device usually entails involves a substrate coated with a barrier layer, but future advances may eliminate the need for a barrier layer.

This embodiment of this aspect of the invention further envisages heating nanocrystal solution-coated substrates to about 300° C. to afford copper films that exhibit bulk resistivity values and a specular bright copper-colored film. Specular is a term that refers to thin film reflectivity. A specular film is one that is shiny and reflective, as a high quality copper film should be. XPS analysis of the present films indicates pure copper metal, with no oxides present. The films of this embodiment are highly adherent, and pass the Scotch® tape test. Moreover, the copper films of this aspect of the invention show no evidence of copper oxides in the film, even before sputtering. Thus, this aspect of the invention provides for pure copper films from copper nanocrystals that also exhibit bulk electrical conductivity. In one embodiment of this aspect of the invention, copper films have domain sizes of about 1 nm to about 10 nm, preferably about 2 nm to about 8 nm and most preferably about 4 nm to about 6 nm. The Example 2 illustrates making copper films using the nanocrystals provided in the present invention.

Another aspect of the current invention relates to a method for producing a microscale structure. First a solvent comprising copper nanocrystals is applied onto a substrate having a feature cut therein, wherein the copper nanocrystals are made using the methodology described supra. The substrate is then heated to form a microscale structure of continuous bulk copper from said nanocrystals within the feature.

"Features" as defined herein are contours machined or fabricated onto the surfaces of substrates, i.e. a featured substrate, using techniques such as lithography. Preferably features are in the form of sub-micron vias and trenches. Microelectronics substrates contain trenches and vias and both need to be filled with copper metal. Usually trenches provide the horizontal wiring, and vias provide the vertical wiring within the chip. Most preferably the features are in the shape of interconnects (IC).

In this embodiment of this aspect of the invention further envisages substrates of silicon, $SiO_2$, or TiN-coated (1000 Å by PVD) flat silicon wafers, and TaN-coated (1000 Å by PVD) flat silicon wafers. $SiO_2$ wafers flat silicon wafers are preferable. TaN-coated are more preferable. TiN coated flat silicon wafers are most preferable. These substrates preferably have an array features such as 0.1×1.0 μm blind vias.

This aspect of the invention further envisages that upon heating to about 125° C. to about 250° C. (where loss of the passivating agent occurs), and small crystallites of copper on the surface after heating to about 280° C. (near where melting of the nanocrystals occurs). Upon heating to about 150° C., wicking of nanoparticles from the plateau region to the via is observed. At about 280° C., a perfectly conformal copper film has been obtained in the via (the bright region corresponds to fluorescence from copper metal). In addition, the invention provides for a small amount of bottom-up fill at about 280° C. The observation of a perfectly conformal copper film in a 0.1×1.0 μm blind via (aspect ratio of 10) with the nanocrystal method described herein, is extremely important. Most notably, the methods of this invention can deposit copper seed layers selectively in the features, without creating a blanket copper coating on plateau regions. This embodiment of this aspect of the invention allows for selective growth of copper metal only in the features by electrochemical deposition, thus greatly reducing the need for CMP after metallization.

One embodiment of this aspect of the invention relates to a method for filling a micro-scale trench. The term trench as defined herein refers to features on a substrate with a high aspect ratio. The narrower the trench width relative to the trench depth, or the deeper the trench relative to the width of the trench, the higher the aspect ratio. The preferable aspect ratio is about 1.6 to about 5000, more preferably about 4 to about 1000 and most preferably about 6 to about 1000. Even more preferably is an aspect ration of about 10 to about 100. First a solvent comprising copper nanocrystals is applied to a substrate having a trench cut therein, wherein the copper nanocrystals are made using the methodology described supra. The substrate is then heated to form continuous bulk copper from the nanocrystals within the trench. One embodiment of this aspect of the invention relates to fabrication of completely conformal copper seed layers in high aspect ratio etched features. Conformal seed layers are required for feature filling by electrochemical deposition, and the present invention provides an inherently conformal process that can coat trenches, i.e. very aggressive, i.e. high aspect ratio, features. Most notably, the methods of this invention can deposit copper seed layers selectively in the features, without creating a blanket copper coating on plateau regions. This embodiment of this aspect of the invention allows for selective growth of copper metal only in the trenches by electrochemical deposition, thus greatly reducing the need for CMP after metallization. Moreover, this embodiment may be used to repair defects in existing seed layers that are deposited by physical vapor deposition. Example 4 demonstrates a high degree of trench filling, with little or no copper deposition on the substrate plateau when using TaN-coated silicon wafers with 0.1×1.0 μm trenches.

Filling in a feature with an aspect ratio of 10 and a pitch of 0.1 μm assures that lower aspect ratio features, such as those required for interconnect structures in the International Technology Roadmap for Semiconductors, (International Technology Roadmap for Semiconductiors: http://public.itrs.net) should be easily filled with copper using the nanocrystals provided herein. TGA and XRD experiments demonstrate that the passivating agent used to create solublize nanocrystals is quantitatively volatilized upon heating of the coated substrates. Pure copper deposits are obtained, as exemplified by the XPS data and observation of bulk copper resistivity. Electron micrographs of filled trenches before and after heating suggest that about 10% to about 30% shrinkage occurs upon heating to about 300° C. Due to the observed "wicking" of nanocrystals into the features upon heating. As such, it is not necessary to apply additional nanocrystals to compensate for densification shrinkage. Instead, a slight excess of nanocrystals can be applied to the substrates to allow movement of nanocrystals on the plateau region to the copper deposits in the trenches. In this way, any shrinkage due to densification can be eliminated during a single heating cycle. As noted supra, a temperature of only about 250° C. to about 350° C. is needed to transform the passivated nanocrystals to high purity copper that exhibits bulk resistivity. This temperature range fits well within the thermal budget for semiconductor processing. See Example 4.

In another aspect of the invention, a substrate that has been patterned by lithography to form a series of features is an exemplary substrate. The preferred embodiment is silicon wafer that has been patterned by lithography and etched to form a series of trenches that have an exposed surface that contains $SiO_2$. Therefore, this aspect of the invention further appreciates that a wetting layer may optionally be applied to the substrate to promote interconnect wetting thereof and to prevent interdiffusion during subsequent IC processing.

In a another aspect of the invention, a solution of dissolved or suspended nanocrystals is applied to the featured surface of a substrate. Preferably, the nanocrystal solution or suspension is concentrated to opaqueness to facilitate rapid deposition of features or preferably trenches and most preferably interconnect structures. Following the evaporation of the solvent, adjacent particles are heated to form bulk domains within the trenches.

Another aspect of the invention contemplates the deposition, delivery or application of nanocrystals to a substrate by range of methods such as spray or spin coating. One of ordinary skill in the art could contemplate further mechanisms for depositing, delivering or coating a substrate with the nanocrystals made using the methodology described herein. The present invention supplants expensive vacuum evaporation equipment with a paint booth or spin coating technology for the formation of integrated circuitry interconnect structures. Please see Examples 2, 3 and 4. Unlike chemical and physical vapor deposition techniques, the present invention selectively deposits nanocrystal particulate in the features or preferably IC trenches, by taking advantage of the slower volatilization of a solvent carrier from trenches, causing the nanocrystals to congregate in high aspect ratio features. As a result, the quantity of extraneous deposition material, which must be removed by CMP, is diminished. Lastly, an environmental benefit results from pre-selecting aqueous and or benign organic solvents the nanocrystal solution and foregoing the environmentally harmful solvents currently used in chip manufacturing processes.

In one embodiment of this aspect of the present invention, nanocrystals are applied to the substrate by applying the solution thereto, such that it is applied to promote uniform deposition of the nanocrystals across whole substrates. Such methods illustratively include atomizing the solution and applying as a fine nanocrystal paint spray; and spin coating the solution onto a rotating substrate.

In one particular embodiment of this aspect of the invention, a binder is dispersed in the solution to minimize particle movement as the solvent pool evaporates. A binder useful in the present invention includes low molecular weight and polymeric organic substances. The binder being chosen such that upon heating to a temperature of less than about 250 to about 300 degrees Celsius, the binder is volatilized. The binder is chosen to minimize binder residues, the residues likely to decrease conductivity of the bulk domain resulting from heating the nanocrystals. Binders illustratively include waxes; aliphatic compounds containing at least eight carbon atoms including carboxylic acids alcohols, aldehydes, amines, thiols and salt thereof wherein the cation is a conductive metal ion illustratively including copper aluminum, magnesium, gold, silver, manganese, molybdenum and the like; polymeric materials which volatilize to greater than about 95% by weight below about 250 degrees Celsius including poly (acrylic acid), polyglycols, polycarbonates, polyalkyls, polyalcohols, polyesters and the like; proteinaceous substrates such as albumin, gelatin and collagen; carbohydrates; and organosilanes.

Another embodiment of the invention relates to passivating agents and binders that decompose to volatile products upon heating to moderate temperatures, and thus yield high purity copper metal deposits. Such materials could include ammonium salts of the formula $RnH4-nN+X-$, where R is a carbon chain and X— is anionic group that can accept a hydrogen atom to provide a gaseous product.

An example would be trioctylammonium decanoate, which would decompose to the volatile species trioctylamine and decanoic acid upon heating to about 100 to about 250 deg. C. Many other combinations are possible, and will be apparent to a skilled practitioner.

In a further embodiment of this aspect of the invention, it is appreciated that a binder is operative herein to increase the nanocrystal solution viscosity such that after solution application to the substrate, a surface coating results which does not generally penetrate trenches and vias associated with the substrate. A surface coating upon heating volatilizes the binder and nanocrystal passivating agent thereby causing the nanocrystals to be wicked into the substrate trenches and vias so as to coat trench and via wall surfaces and initiate top to bottom substrate feature fill. This inventive feature fill technique is particularly well suited for the formation of barrier layers and seed layers.

This aspect of the present invention further identifies cost savings associated with production defects. Nanocrystal deposition of substrate features is both reversible and repairable. Poor deposition technique is corrected by resolubilizing or re-dissolving nanocrystals stranded on a feature-containing substrate by solvent washing prior to sintering the nanocrystals. Further, feature or trench regions showing incomplete filling or separation from the trench walls can be remedied after sintering or melting to form bulk material interconnect features through the reapplication of a nanocrystal solution. Because the solvent containing the nanocrystals can freely penetrate fissures and voids associated with an IC patterned for an interconnect feature, additional nanocrystals are deposited into poorly filled features.

In another aspect of the invention, a nanocrystal solution is applied to flood the substrate surface yet nanocrystals selectively settle in the feature or trench recesses within the substrate surface, including those shadowed or otherwise obscured from evaporative methods. In the process nanocrystals dissolved or suspended in the solution are carried into these regions. This process is selective for nanocrystal deposition in substrate features because the solvent volatilizes more quickly from the substrate plateaus as compared to the feature recesses causing the nanocrystals to become concentrated in the shrinking solvent pools within the feature or trench recesses. Therefore, it is beneficial to allow the solvent to evaporate at a temperature below sinter temperature to allow for nanocrystal concentration in substrate features. Evaporation time may range from a few minutes to tens of hours. This is highly dependent on the solvent being used, the temperature, and the pressure. Generally the evaporation time is nearly inversely proportional to the vapor pressure of the solvent. For the solutions studied typical evaporation times were in the range of about 5 min to about 20 min. Eventually, the nanocrystals become stranded in the dry trenches. Heating the substrate to a temperature sufficient to sinter or melt the nanocrystals results in the formation of bulk domains. Preferably, substantially pure bulk Cu domains.

Another aspect of the invention contemplates a substrate comprising an barrier layer. Preferably, the barrier layer is a layer of TiN or TaN having a sufficient thickness to assure continuity. There are many barrier materials that may be considered such as TiN, TaN, WxN, Ta—Si—N, Ti—Si—N, Ta, Ta2N, and others. Such barrier layers are formed by evaporation of a base metal layer onto the featured substrate and thereafter exposing the base metal layer to a nitrogen plasma to induce a surface nitriding as is conventional to the art. Preferably, the nanocrystal solutions disclosed herein are coated onto barrier layers.

Another aspect of the invention contemplates instances where copper nanocrystals are deposited onto a substrate that is coated with an intermediate conventional adhesion-promoting layer. In one embodiment of this aspect of the invention, a hydrophobic solvent is used to coat a hydrophilic oxide surface. The solvent can be induced to wet the oxide surface by washing the substrate surface with a silanol or similar surfactant prior to deposition of the particle containing solvent. The silanol wash creates a thin layer that projects organic functionalities away from the surface which attractively interact with the particle surfaces of hydrophobic particles and simultaneously bonds to the oxide surface through the hydroxyl functionality. It is appreciated that other adhesion promoters known to the art of laminating non-wettable oxide and metallic layers are operative herein under the disclosed thermal conditions.

In yet another aspect of the present invention, the solvent utilized to form a solution of nanocrystals made using the methodology described herein, is optionally aqueous or organic. The solvent is chosen based on factors including, but not limited to hydrophilicity of the substrate surface, solubility of the nanocrystals therein, which passivating agent was used, vapor pressure, toxicity, purity and the like. Solvents may include but are not limited to water, acetonitrile, methanol, isopropanol, hexanes, dodecane, toluene, cyclohexanone, diethyl ether, tetrahydrofuran, dichloromethane, acetone, and ethanol. The invention contemplates the use of solvents ranging from fluorocarbons to water, and everything in between, through manipulation of the chemical character of the passivating agent.

Yet another aspect of the invention, recognizes that there are three temperature ranges important to the process of converting a feature of a substrate such as a trench on a substrate, filled with nanocrystals into an operative IC structure. The nanocrystal application temperature occurs at any temperature at which the solvent is liquid. It is appreciated that higher application temperature decreases the number of substrate surface sites a nanocrystal contacts prior to being stranded on a dry substrate. In a preferred embodiment, the nanocrystal surface is coated with a passivating agent that imparts solvent solubility to the nanocrystal. Upon heating a nanocrystal filled substrate above the passivating agent thermalization temperature, the passivating agent is volatilized. This provides for clean nanocrystal surfaces because of contiguous nanocrystals contacts. While the passivating agent volatilization temperature is largely size independent and related to the chemisorption or physisorption energy between the passivating agent and the nanocrystal surface atoms, nanocrystal sintering and melting temperature are controllable over hundreds of degrees Celsius through nanocrystal size domain selection. Once the passivating agent is volatilized contiguous nanocrystals are able to sinter.

A still a further aspect of the present invention, is capable of overcoming prior art limitations regarding dimensional shrinkage associated with densification, thin film instability through repetitive nanocrystal solution application. (K. T. Miller et al., J. Mater Res. 5 (1990), pp. 151–160; B. A. Korgel and D. Fitzmaurice, Phys. Rev. Let. 80 (1998), pp. 3531–3534; A. G. Evans et al., J. Mater. Res. 3 (1988), pp. 1043–1049). Significant shrinkage is associated with passivating agent volatilization, thus after applying a nanocrystal solution to a substrate, the substrate is heated to the passivating agent volatilization temperature and additional nanocrystal solution applied to fill feature voids associated with volatilization. This process is optionally repeated prior to raising the substrate to a sintering of melting temperature for the nanocrystal mass filling a substrate feature such as a trench or via. It is appreciated that nanocrystal deposition is optionally carried out at a temperature above the passivating agent volatilization temperature such that active nanocrystal surfaces are formed upon contact with a trenched substrate.

Yet a further aspect of the invention envisages filling a trench of a substrate with enough particles such that the particles as deposited are at or above the percolation threshold. The percolation threshold is defined herein as a spatial density of particles sufficient to traverse the region through at least one continuous pathway of contiguous particles. To assure percolation threshold attainment and therefore conductivity upon sintering or fusing the particles, a trench feature is preferably at least 7 particle widths in the directions parallel to the substrate surface. Thus, the instant invention is best utilized with features larger than about 7 nm.

Having described the inventions, the following illustrative examples are provided which are not intended to limit the scope of the invention.

EXAMPLES

Example 1

Synthesis and Characterization of Copper Nanocrystals Procedure 1A Using 1-decyl-2-methylimidazole as Passivating Agent Under argon and at room temperature 20 mL of pyridine was added to a vigorously stirred 0.25 M pale blue solution of copper nitrate (25 mL, 6.25 mmol) and the color immediately became deep blue. Hexanes (50 mL) was then added. To the mixture a freshly prepared solution of $NaBH_4$ (0.60 g) in water (40 mL) was added dropwise in a period of 15 minutes and further stirring was continued for another 15 minutes to afford a (red) brown mixture. If stirring was stopped a brown aqueous phase and a colorless hexanes phase could be observed. To the stirred red-brown mixture 1-heptyl-4-(4-pyridyl) pyridium bromide (0.697 g, 2.08 mmol, from Aldrich) was added and stirred for 30 minutes followed by addition of 1-decyl-2-methylimidazole (0.700 g, 3.125 mmol, from Aldrich) and stirring for half an hour. Black insoluble material was formed in the aqueous phase and partially precipitated. The mixture was filtered on M-frit glass in air and the residue was washed with water and hexanes. After dried in vacuo overnight at room temperature black powder (0.430 g) was obtained. The black powder was considerably soluble in EtOH, and soluble in acetone and cyclohexanone. After heated under 5% $H_2/N_2$ at 320° C. for 2.5 hours, red-brown powder/thin film was obtained, XRD of which revealed pure crystalline copper.

Procedure 1B Using 1-decyl-2-methylimidazole as Passivating Agent

Under argon and at room temperature 20 mL of pyridine was added to a vigorously stirred 0.25 M pale blue solution of copper nitrate (25 mL, 6.25 mmol) and the color immediately became deep blue. Hexanes (50 mL) was then added. To the mixture a freshly prepared solution of $NaBH_4$ (0.60 g) in water (40 mL) was added dropwise in a period of 15 minutes and further stirring was continued for another 15 minutes to afford a (red) brown mixture. If stirring was stopped a brown aqueous phase and a colorless hexanes phase could be observed. To the stirred red-brown mixture 1-decyl-2-methylimidazole (1.390 g, 6.25 mmol, from Aldrich) and 1-dodecylpyridium chloride hydrate (1.000 g, 3.52 mmol, from Aldrich) were successively added and stirred for half an hour. Black insoluble material was formed and partially precipitated. The hexanes phase was colorless and the aqueous phase is pale brown. The mixture was filtered on M-frit glass in air and the collected residue was washed with water and hexanes. During washing certain amount of pale blue material was formed on the inside wall of the funnel, indicating partial oxidization of the product. After the residue was first washed with water, hexanes (15 mL) was added to the residue and the black material on frit-glass was transferred to a clean M-frit glass funnel and washed with heaxanes. After dried in vacuo overnight at room temperature black powder (0.455 g) was obtained. The black powder was considerably soluble in EtOH, and soluble in acetone and cyclohexanone. After heated under 5% $H_2/N_2$ at 320° C. for 2.5 hours, red-brown powder/thin film was obtained, XRD of which revealed pure crystalline copper.

Procedure 2 Using Tetraoctylammonium Decanoate as Passivating Agent

Pyridine (25 mL) was added to an aqueous 0.10 M solution of copper(II) nitrate (25 mL) with rapid stirring. The resulting dark blue solution was treated dropwise with 0.40 M sodium borohydride (20 mL) with continued stirring, to afford a red-brown solution. When effervescence had subsided, the solution was treated with tetraoctylammonium decanoate in 50 mL of toluene. After approximately 10 min of rapid stirring, the dark crimson colored mixture was centrifuged (~10 min, <5000 rpm) to yield a biphasic mixture and a brown precipitate. The supernatant blue toluene phase was discarded. The precipitate was collected by vacuum filtration of the aqueous phase, washing any residual precipitate from the centrifuge tube with water. The collected solid was washed copiously with water. Copper nanoparticles were extracted from the brown solid via multiple washings with hexanes, with the soluble material passing through the filter frit. The red-brown hexane solution of nanoparticles was passed through a 0.2 μm syringe filter to remove any finely suspended material. A brown solid could then be obtained by removal of solvent under reduced pressure and stored under an atmosphere of argon using standard Schlenk apparatus. The solid can easily be redissolved in hydrocarbon solvents as desired.

Preparation of Tetraoctylammonium decanoate: Decanoic acid (1.70 g) was dissolved in aqueous 0.30 M potassium hydroxide (100 mL). The solution was treated with 0.01 M tetraoctylammonium bromide (50 mL) in toluene. The milky white mixture was stirred rapidly and transferred to a separatory funnel. Upon standing, two phases appeared. The toluene phase was collected and subsequently used in the preparation of copper nanoparticles given above.

Procedure 3 Using Sodium Decanoate as Passivating Agent

Aqueous copper(II) nitrate (25.0 mL, 0.10 M) was treated with pyridine (0.80 mL) to afford a deep blue solution. With rapid stirring, sodium borohydride (20 mL, 0.40 M) was added dropwise. Upon addition of the first few drops, the color of the reaction mixture changed rapidly to green, then finally to dark brown. Continued addition led to vigorous gas evolution and much foaming. When the foaming had largely subsided, the muddy brown mixture was treated with aqueous sodium decanoate (30 mL, 90 mM) under rapid stirring. After approximately 15 min of continued stirring, the reaction mixture was centrifuged until a dark brown precipitate and a clear, colorless supernatant solution was observed. The brown solid was washed with several portions of water, followed by ethanol. The solid was taken to dryness under reduced atmosphere using schlenk apparatus. It could be dissolved in organic solvents such as diethyl ether or toluene.

Procedure 4 Using Tetraoctylammonium Octylxanthate as Passivating Agent

Aqueous copper(II) nitrate (25.0 mL, 0.10 M) was treated with varying amounts of pyridine (0.8 mL, 1 mL, 10 mL, 25 mL, and 50 mL) to afford deep blue solutions. With rapid stirring, each solution was treated dropwise with aqueous sodium borohydride (20 mL, 0.40 M). Each reaction mixture exhibited a color change to a dark brown or reddish-brown color. The reaction mixtures containing 0.8 mL and 1 mL pyridine became muddy in appearance with considerable foaming. The reaction mixtures containing greater amounts of pyridine became clear, reddish-brown solutions. Upon reduction, the reaction mixtures were each treated with tetraoctylammonium octylxanthate in 100 mL toluene (see below). With rapid stirring, the color was observed to migrate from the aqueous phase to the organic phase. Some copper-colored opalescence was noted during the transfer. After about 15 min, the aqueous phase was observed to be colorless and clear. The organic and aqueous phases were separated and the aqueous phase discarded. The nanoparticle containing toluene phase was centrifuged to remove suspended solids and was transferred to a schlenk flask for storage under argon. The solution could be taken to dryness under reduced pressure and redissolved in numerous organic solvents as desired.

Preparation of tetraoctylammonim octylxantate: Potassium octylxanthate was prepared using literature methods. A toluene solution of tetraoctylammonium bromide (0.670 g in 100 mL toluene) was treated with an aqueous solution of potassium octylxanthate (0.300 g in 50 mL water) The biphasic mixture was stirred rapidly for a period of approximately 2 h, after which time the yellowish color of the xanthate had transferred to the toluene phase. The toluene and aqueous phases were separated. The toluene phase, containing tetraoctylammonium octylxanthate, was used in the above nanoparticle preparation.

Analysis

Figure 2:
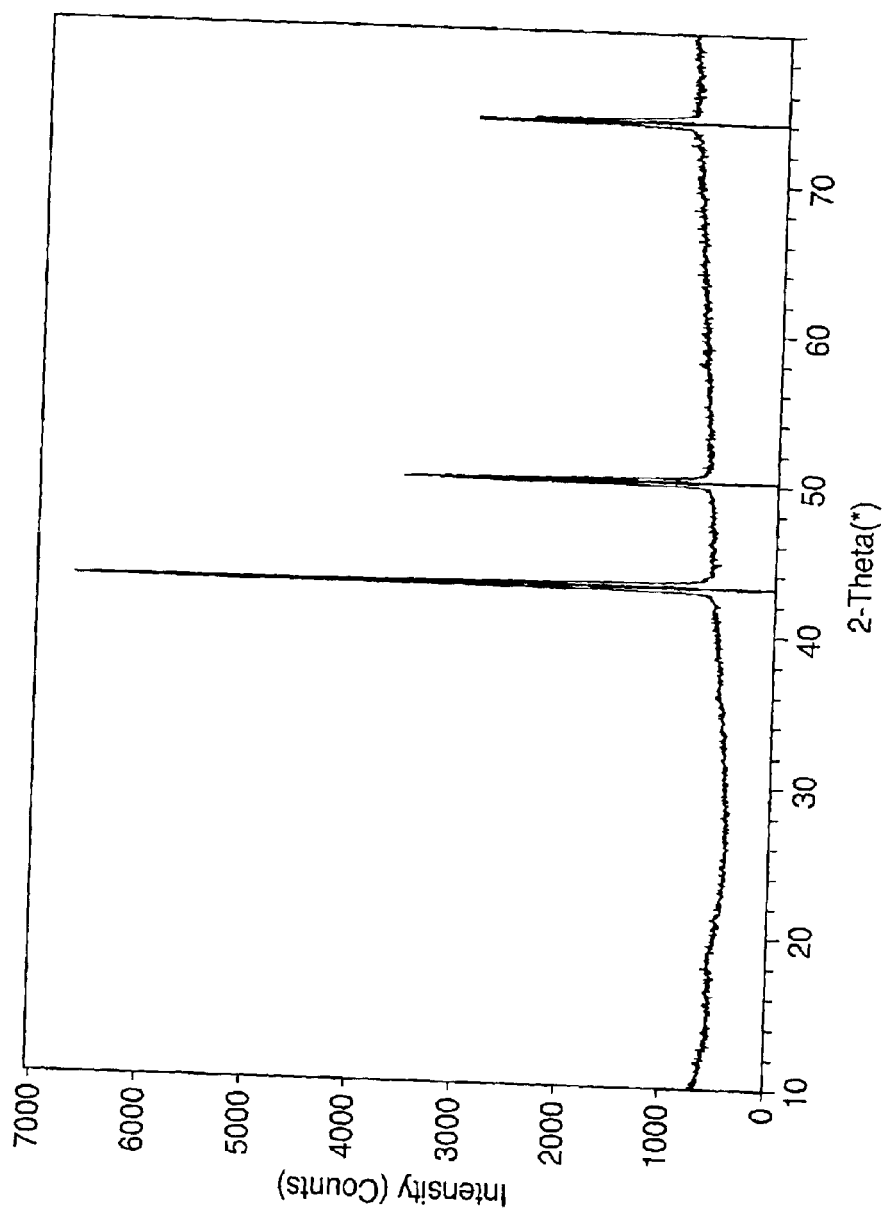
FIG. 2 shows X-Ray diffraction spectrum of copper nanocrystals after heating to 350° C. with reference copper metal spectrum overlaid.

Transmission electron microscopy (TEM) demonstrated reproducible nanocrystal sizes of 5.5±1.0 nm for samples obtained using the methods described herein. Nanocrystal size was not dependent upon the nature of the final passivating agent, provided that the initial copper(II) salt and pyridine concentrations were held constant. X-ray diffraction (XRD) spectra revealed very broad reflections consistent with copper metal, with crystalline domain sizes of <10 nm. The onset of nanocrystal melting is generally in the range of 250° C. to 450° C., with the melting point of a 5.5±1.0 nm nanocrystal sample typically occurring at or near 350° C. as determined by differential thermal analysis. The infrared and $^1$H nuclear magnetic resonance (NMR) spectra of the nanocrystals showed only the final passivating agents to be present; no pyridine was observed. The nanocrystals were highly soluble in many organic solvents, including hexane, toluene, acetone, and ethyl lactate. Solutions of up to 10 wt. % copper nanocrystals were obtained in hexane, demonstrating the high solubility of the nanocrystals. There was no evidence for light scattering by the solutions, ruling out colloids. A 10 wt. % copper nanocrystal solution in hexane was unchanged after 1 month at 23° C. under an argon atmosphere, demonstrating that the particles do not agglomerate or settle over extended periods of time. The copper nanocrystals are stable for days under ambient atmosphere at 23° C. in the solid state. In solution, exposure to ambient atmosphere results in oxidation to green, insoluble copper oxide materials over 12–24 h. Accordingly, solutions of the copper nanocrystals were handled under protective nitrogen atmospheres. Thermogravimmetric analysis (TGA) of the carboxylate- and imidazole-passivated nanocrystals revealed weight loss between 150–300° C. (sublimation of the passivating agents) to afford ceramic yields of 68–73% (FIG. 1). With selection of a suitable imidazole or ammonium or alkylammonium alkylcarboxylate ligand, no weight loss is observed above 300° C. XRD spectra of the residue from the TGA experiment shown in FIG. 1 demonstrated that pure copper metal was the only crystalline product (FIG. 2). Separate bulk thermolysis experiments with the carboxylate- and imidazole-passivated nanocrystals at 350° C. under a 5% hydrogen/95% nitrogen atmosphere led to 70–75% yields of copper metal (as determined by XRD). Since the particles melt at about 350° C., beautiful fractal-shaped, shiny copper metal deposits were obtained in the bulk thermolyses.

Example 2

Copper Films from the Passivated Nanocrystals

Synthesis of 5.5±1.0 nm copper nanocrystals are passivated with either tetra-n-octylammonium decanoate or 1-decyl-2-methylimidazole. These copper nanocrystals melt at about 350° C., exhibit X-ray diffraction spectra consistent with copper metal, and are highly soluble (up to 10 wt. %) in organic solvents ranging from n-alkanes to ethyl lactate. Thermolysis of the nanocrystals at 350° C. under a nitrogen/hydrogen atmosphere afforded pure copper metal, with complete evaporation of the passivating agents. Weight loss upon heating, as measured by thermogravimetric analysis, was 27–32%. Thermogravimetric analysis also indicated that evaporation of the passivating agents occurs between 150–250° C. A 6 wt. % dodecane solution of 5.5±1.0 nm tetra-n-octylammonium decanoate-passivated copper nanocrystals was spin coated onto a TaN-coated (1000 Å by PVD) flat silicon wafer. Spin coating of nanocrystal solutions onto a TaN-coated silicon wafer, followed heating at 350° C. under a 5% hydrogen/95% nitrogen atmosphere, afforded copper films that exhibited bulk resistivity values and led to a specular, bright copper-colored film. XPS analysis of these films indicated pure copper metal, with no oxides present. The films were highly adherent, and passed the Scotch® tape test. The XRD spectrum revealed reflections due only to copper metal. X-ray photoelectron spectroscopy showed ionizations due to copper metal (2p 3/2= 932.5±0.1 eV), oxygen, and carbon. The oxygen and carbon signals were nearly eliminated after sputtering for 150 s, suggesting that these elements are surface contaminants. There was no evidence for copper oxides in the film, even before sputtering. Thus, pure copper films were obtained from the nanocrystals. The electrical resistivity of a 20-nm thick copper film was 2.7 microhm cm, which is identical to the resistivity obtained for a 20-nm thick pure copper film that has been reported in a recent study. Kuan, et al., MRS Symp.Proc. 612, D7.1.1–8 (2000). Accordingly, these films exhibit bulk electrical conductivity. A scanning electron micrograph of the copper film showed a smooth surface, with domain sizes of 4–6 nm.

Example 3

Spin Coating and Heating of the Passivated Nanocrystals

A dilute (<1 wt. %) pyridine solution of copper nanocrystals is spin coated onto a silicon wafer containing an array of 0.1×1.0 μm blind vias. Notably, substrates that are heated to about 300° C. do not have a continuous copper film on the substrate plateau. The substrate following nanocrystal deposition prior to heating shows completely conformal coverage of the vias and plateau region. Upon heating to 150° C., wicking of nanoparticles from the plateau region to the via is observed. At about 300° C., a perfectly conformal copper film has been obtained in the via.

Example 4

Complete Trench Filling

Conformal copper seed layers are required for copper fill using electrochemical deposition, and the fabrication of such layers in high aspect ratio features is currently a severe problem. In addition, the selective deposition of copper metal in the vias (and lack of a continuous copper film on the plateau region) suggests that CMP could be greatly reduced using the nanocrystals of the present invention.

Figure 3:
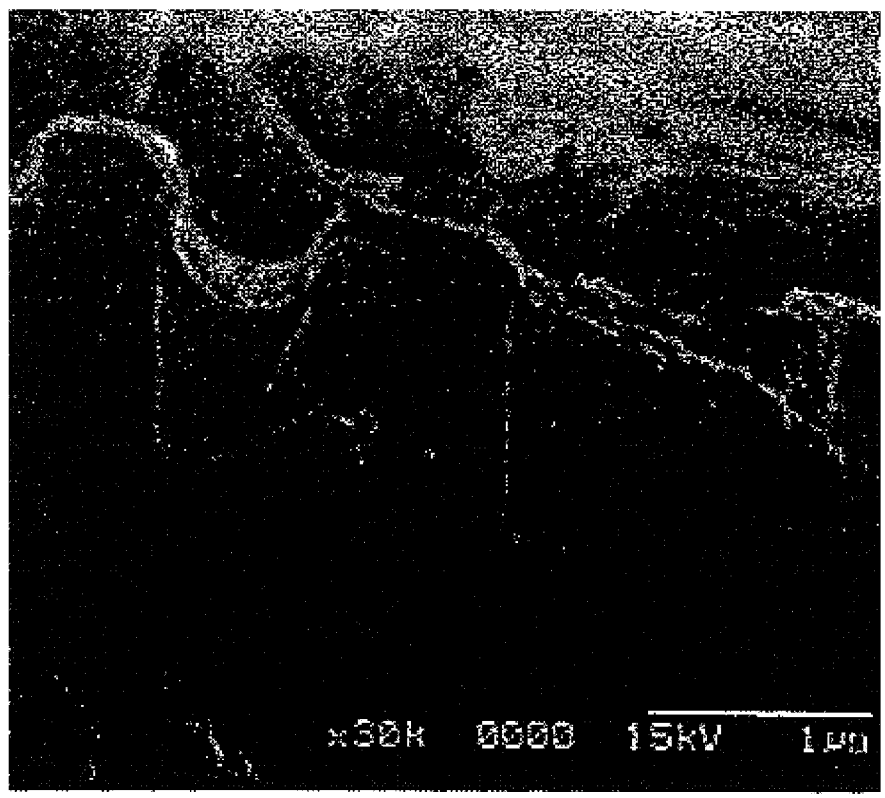
FIG. 3 shows conformal, bottom-up fill of trenches with copper nanocrystals prior to heating.
Figure 4:
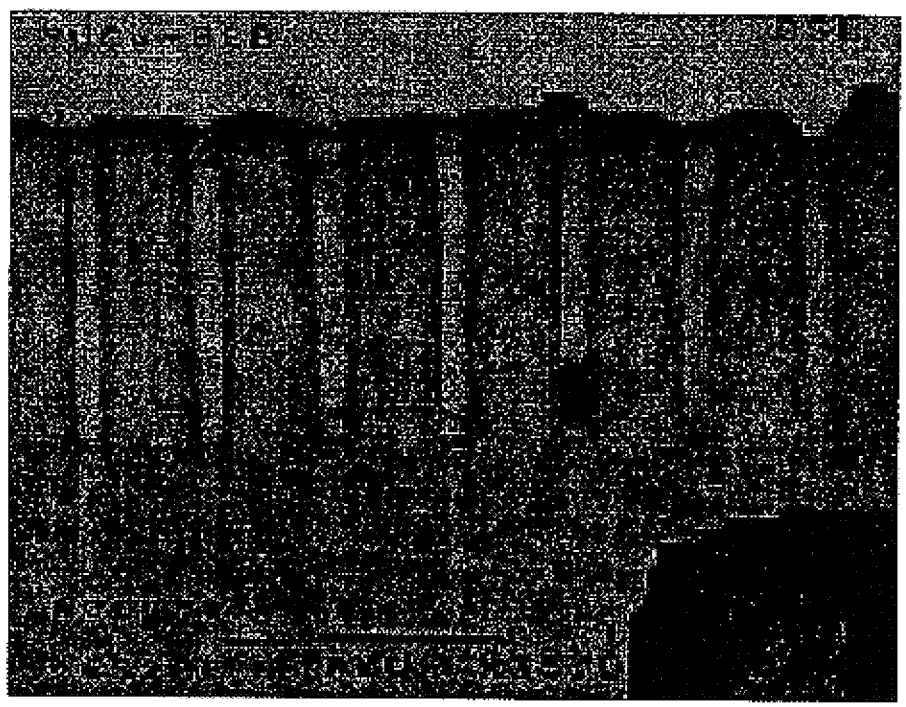
FIG. 4 shows a reverse contrast cross-sectional micrograph of copper-filled 0.1×1.0 µm trenches on TaN-coated silicon substrate.

The other EXAMPLES disclosed herein, sought to assess bottom-up filling of trenches with copper nanocrystals prior to heating. FIG. 3 shows a sectioned micrograph of an as-deposited trenched silicon wafer (SiO$_2$ surface) prior to heating (the wafer was only cleaved and was not polished on the edge to avoid any heating of the copper nanocrystals, hence the rough edge). The trenches show conformal, bottom-up fill. Due to potential adhesion problems between copper and silicon dioxide, we sought to obtain a TaN-coated trenched silicon wafer to assess feature filling on a metallized substrate. The substrates were generously provided by Ron Powell of Novellus Systems. FIG. 4 shows a cross sectional SEM image shown in negative of an array of 0.1×1.0 μm trenches onto which a 6% dodecane solution of 5.5±1.0 nm tetra-n-octylammonium decanoate-passivated copper nanocrystals was spin coated. After spin coating and solvent evaporation, the substrate was heated to 350° C. under a 5% hydrogen/95% nitrogen atmosphere. This test pattern is extremely aggressive (aspect ratio of about 10). In spite of the aggressive pitch, the trenches are nearly all completely filled with copper metal. There is not a continuous copper film on top of the substrate plateau, consistent with experiments described above. Notably, trenches #1,2, 5,7 (counting from left) are perfectly filled, while trenches

3, 4, 6 each show a small void near the surface of the substrate. The fact that the trenches have been nearly perfectly filled indicates that the subject invention provides spin-coating conditions for trench fill with very low void density. The subject invention's spin on copper metallization can fill high aspect ratio features (aspect ratio of about 10) that are well beyond those used in commercial applications. Copper interconnect aspect ratios typical of the current device generation is 1.6.

It is appreciated that various modification of the present invention in addition to those shown and described herein will be apparent to those skilled in the art from the above description. Such modifications are also intended to fall within the scope of the appended claims.

All references cited herein are intended to be incorporated by reference to the same extent as if each was individually and explicitly incorporated by reference.

What is claimed is:

1. A method for producing a copper film comprising the steps of:
   (a) applying a solvent comprising copper nanocrystals dissolved therein onto a substrate, wherein said copper nanocrystals are made by;
      (i) reducing a copper salt with a reducing agent to obtain reduced copper;
      (ii) providing a passivating agent to contact said reduced copper, wherein said passivating agent comprises at least one moiety selected from the group consisting of a nitrogen donor and an oxygen donor; and
      (iii) isolating said nanocrystals comprising said reduced copper; and
   (b) heating said substrate to form a film of continuous bulk copper from said nanocrystals on said substrate.

2. The method of claim 1, wherein said substrate comprises silicon.

3. A method of claim 1, wherein said substrate comprises $SiO_2$.

4. A method of claim 1, wherein said substrate is covered with a barrier layer.

5. A method of claim 1, wherein said substrate is washed with a surfactant.

6. A method of claim 1, wherein said nanocrystals are re-dissolved prior to said heating.

7. A method of claim 1, wherein the solvent further comprises a binder.

8. The method of claim 1, wherein the passivating agent comprises an imidazole moiety.

9. The method of claim 1, wherein the nitrogen donor is selected from the group consisting of imidazole, pyridine, bipyridine, phenanthroline, ammine, amine, nitrile, and nitride.

10. The method of claim 1, wherein the passivating agent is 1-decyl-2-methylimidazole.

11. The method of claim 1, wherein the passivating agent comprises an ammonium or alkylammonium alkylcarboxylate moiety.

12. The method of claim 1, wherein the oxygen donor is selected from the group consisting of tetraoctylammonium, alkoxides, oxides, ethers, carboxylates, acetoacenoates, sulphoxide, hydroxide, acetate, lactate, propionate, oxalate, and maltolate.

13. The method of claim 1, wherein the oxygen donor is selected from the group consisting of sodium decanoate, tetraoctylammonium octylxanthate, potassium octylxanthate and tetraoctylammonium octylxanthate.

14. The method of claim 1, wherein the passivating agent is tetra-n-octylammonium decanoate.

15. The method of claim 1, wherein said nanocrystals are about 1 to about 20 nanometers in size.

16. The method of claim 1, where the nanocrystals melt at less than about 350° C.

17. The method of claim 1, wherein the nanocrystals are soluble in a solvent.

18. The method of claim 16, wherein the solvent is selected from the group consisting of water, acetonitrile, methanol, isopropanol, hexanes, dodecane, toluene, cyclohexanone, diethyl ether, tetrahydrofuran, ethyl lactate, dichloromethane, acetone and ethanol.

19. The method of claim 1, wherein the passivating agent volatilizes between about 125° C. to about 250° C.

20. The method of claim 1, wherein weight loss upon heating said nanocrystals is in the range of about 15 to about 40%.

21. A method for filling a feature on a substrate with copper comprising the steps of:
   (a) applying a solvent comprising copper nanocrystals dissolved therein onto said featured substrate, wherein said copper nanocrystals are made by;
      (i) reducing a copper salt with a reducing agent to obtain reduced copper;
      (ii) providing a passivating agent to contact said reduced copper, wherein said passivating agent comprises at least one moiety selected from the group consisting of a nitrogen donor and an oxygen donor; and
      (iii) isolating said nanocrystals comprising said reduced copper; and
   (b) heating said substrate to fill said feature by forming continuous bulk copper from said nanocrystals in said feature.

22. The method of claim 21, wherein said substrate comprises silicon.

23. A method of claim 21, wherein said substrate comprises $SiO_2$.

24. A method of claim 21, wherein said substrate is covered with a barrier layer.

25. A method of claim 21, wherein said substrate is washed with a surfactant.

26. A method of claim 21, wherein said nanocrystals are re-dissolved prior to said heating.

27. A method of claim 21, wherein the solvent further comprises a binder.

28. The method of claim 21, wherein said feature is a via.

29. A method of claim 21, wherein said feature is a trench with an aspect ratio in the range of about 1.6 to about 10000.

30. A method of claim 21, wherein said feature is in the form of an interconnect (IC).

31. A method of claim 21, wherein said nanocrystals selectively collect within recesses of said features as opposed to plateaus of said substrate.

32. The method of claim 31, wherein the solution evaporates prior to said heating.

33. The method of claim 21, wherein said feature is filled such that the nanocrystals are at or above their percolation threshold.

34. The method of claim 21, wherein the passivating agent comprises an imidazole moiety.

35. The method of claim 21, wherein the nitrogen donor is selected from the group consisting of imidazole, pyridine, bipyridine, phenanthroline, ammine, amine, nitrile, and nitride.

36. The method of claim 21, wherein the passivating agent is 1-decyl-2-methylimidazole.

37. The method of claim 21, wherein the passivating agent comprises an ammonium or alkylammonium alkylcarboxylate moiety.

38. The method of claim 21, wherein the moiety is selected from the group consisting of tetraoctylammonium, alkoxides, oxides, ethers, carboxylates, acetoacenoates, sulphoxide, hydroxide, acetate, lactate, propionate, oxalate, and maltolate.

39. The method of claim 21, wherein the oxygen donor is selected from the group consisting of sodium decanoate, tetraoctylammonium octylxanthate, potassium octylxanthate and tetraoctylammonium octylxanthate.

40. The method of claim 21, wherein the passivating agent is tetra-n-octylammonium decanoate.

41. The method of claim 21, wherein said nanocrystals are about 1 to about 20 nanometers in size.

42. The method of claim 21, where the nanocrystals melt at less than about 350° C.

43. The method of claim 21, wherein the nanocrystals are soluble in a solvent.

44. The method of claim 43, wherein the solvent is selected from the group consisting of water, acetonitrile, methanol, isopropanol, hexanes, dodecane, toluene, cyclohexanone, diethyl ether, tetrahydrofuran, ethyl lactate, dichloromethane, acetone and ethanol.

45. The method of claim 21, wherein the passivating agent volatilizes between about 125° C. to about 250° C.

46. The method of claim 21, wherein weight loss upon heating said nanocrystals is in the range of about 15 to about 40%.

* * * * *